United States Patent
Rowell

(10) Patent No.: US 11,474,138 B1
(45) Date of Patent: Oct. 18, 2022

(54) OVER-THE-AIR MEASUREMENT SYSTEM

(71) Applicant: Rohde & Schwarz GmbH & Co. KG, Munich (DE)

(72) Inventor: Corbett Rowell, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 17/505,386

(22) Filed: Oct. 19, 2021

(51) Int. Cl.
  *H04W 24/00* (2009.01)
  *G01R 29/10* (2006.01)
  *H04B 17/10* (2015.01)
  *G01R 29/08* (2006.01)

(52) U.S. Cl.
  CPC ....... *G01R 29/105* (2013.01); *G01R 29/0821* (2013.01); *G01R 29/0871* (2013.01); *H04B 17/102* (2015.01); *H04W 24/00* (2013.01)

(58) Field of Classification Search
  CPC .............. G01R 29/105; G01R 29/0821; G01R 29/0871; H04B 17/102; H04W 24/00
  USPC ............................................ 455/67.11, 67.14
  See application file for complete search history.

(56) References Cited

U.S. PATENT DOCUMENTS

| | | | |
|---|---|---|---|
| 11,175,337 B2* | 11/2021 | Toben-Heiken | H01Q 5/30 |
| 11,342,961 B1* | 5/2022 | Vis | H04B 5/0043 |
| 2018/0034562 A1* | 2/2018 | Foegelle | H04B 17/0085 |
| 2021/0063480 A1* | 3/2021 | Toben-Heiken | H01Q 1/50 |
| 2021/0175620 A1* | 6/2021 | Adamo | H04B 17/17 |
| 2021/0247431 A1* | 8/2021 | Maruo | H01Q 3/16 |
| 2022/0034961 A1* | 2/2022 | Rowell | H01Q 13/0275 |

FOREIGN PATENT DOCUMENTS

WO  2015/181405 A1  12/2015

* cited by examiner

*Primary Examiner* — Hai V Nguyen
(74) *Attorney, Agent, or Firm* — Christensen O'Connor Johnson Kindness PLLC

(57) ABSTRACT

The present disclosure provides an over-the-air measurement system for testing a device under test. The over-the-air measurement system includes at least two orthomode transducers and at least two antennas. Each of the antennas is connected to a dedicated orthomode transducer respectively, thereby establishing at least two measurement modules. The at least two orthomode transducers are rotated relative to each other, thereby providing different measurement polarizations of the at least two measurement modules with respect to a common reference plane.

16 Claims, 2 Drawing Sheets

OVER-THE-AIR MEASUREMENT SYSTEM

FIELD OF THE DISCLOSURE

Embodiments of the present disclosure relate to an over-the-air measurement system for testing a device under test.

BACKGROUND

In the state of the art, over-the-air (OTA) measurement systems for testing a device under test are known. Typically, so-called compact antenna test ranges (CATRs) are used to test the respective device under test, wherein the compact antenna test range has a testing chamber, e.g. an anechoic chamber also called RF-shielded chamber, in which the device under test is placed for testing purposes. The measurement system provides a quiet zone within the testing chamber, wherein the quiet zone is associated with a testing location at which the device under test is placed during the testing. In compact antenna test ranges, at least one reflector may be used that is located in a beam path established between the test location and a respective feed antenna, also called measurement antenna, in order to increase the travelling distance of the electromagnetic waves, thereby ensuring (indirect) far-field (IFF) conditions at the test location located within the quiet zone.

The respective devices under test typically comprise dual-polarized antennas so that it is necessary to make a minimum of four measurements with four different measurement polarizations in order to measure axial ratio and maximum power of the respective device under test. For instance, the devices under test use dual-polarized electromagnetic waves. Hence, the devices under test may relate to FR1 and/or FR2 base stations, FR2 user equipment and radar devices.

In the state of the art it is known to use two separately formed feed antennas and a mechanical feed switcher that mechanically moves the feed antennas in order to test the four different measurement polarizations.

In other words, the feed antennas are changed mechanically, namely moved, which however increases the overall costs of the over-the-air measurement system. In addition, the overall measurement time is relatively high due to the fact that the measurement has to be interrupted when moving the feed antennas.

Therefore, there is a need for a cost-efficient way to perform the respective tests.

SUMMARY

Embodiments of the present disclosure provide an over-the-air measurement system for testing a device under test. In an embodiment, the over-the-air measurement system comprises at least two orthomode transducers and at least two antennas. Each of the antennas is connected to a dedicated orthomode transducer respectively, thereby establishing at least two measurement modules. The at least two orthomode transducers are rotated relative to each other, thereby providing different measurement polarizations of the at least two measurement modules with respect to a common reference plane.

The main idea is that the at least two measurement modules having the orthomode transducers are rotated relative to each other such that they provide different measurement polarizations simultaneously when testing the device under test due to their relative rotated arrangement. In other words, the orthomode transducers are positioned with respect to each other such that a respective polarization reference plane associated with one of the orthomode transducers is tilted with respect to the other one due to the relative rotation.

In general, the at least two measurement modules are rotated with respect to each other such that the polarizations of their antennas are inclined accordingly, for example with respect to the common reference plane.

Since the at least two measurement modules are fixedly arranged, e.g., not moved with respect to each other during the testing, an orthomode transducer assembly is provided.

The orthomode transducer assembly comprises the at least two measurement modules that are stationary or rather static during the testing of the device under test. The measurement modules can include, for example, one or more circuits.

Therefore, the different measurement polarizations are obtained due to the respective (static) arrangement of the at least two measurement modules with respect to each other rather than due to a movement of the at least two measurement modules with respect to each other.

An aspect provides that each of the at least two antennas is a dual-polarized antenna. Therefore, the dual-polarized antennas each provide two different measurement polarizations simultaneously. The two different measurement polarizations per antenna are tilted with respect to each other due to the relative rotation of the orthomode transducers with respect to each other.

For example, the at least two antennas together provide four different measurement polarizations in total. Since each of the at least two antennas provide two different measurement polarizations and both antennas are rotated with respect to each other, four different measurement polarizations are obtained. These different measurement polarizations are required for testing dual-polarized devices under test appropriately, for example dual-polarized antennas under test or rather devices under test with dual-polarized antenna(s).

Another aspect provides that the at least two orthomode transducers are arranged relative to each other such that the different measurement polarizations are offset from each other by 45° with respect to the common reference plane. Accordingly, the corresponding polarization reference plane of at least one orthomode transducer is tilted by 45° with respect to the one of the other orthomode transducer, which may be parallel to the common reference plane, e.g., a horizontal plane.

Therefore, both dual-polarized antennas provide polarizations at 0° and 90° (first dual-polarized antenna) as well as at −45° and +45° (second dual-polarized antenna). Therefore, four different measurement polarizations are provided simultaneously. In other words, four different measurement polarizations can be obtained without the necessity to move or rather rotate one of the antennas or rather one of the orthomode transducers due to their specific static arrangement, which already ensures four different measurement polarizations.

Accordingly, the measurement time can be reduced significantly, as it is not necessary to move or rather rotate a component during the testing in order to ensure to test the device under test by means of four different measurement polarizations at least.

A further aspect provides that the number of antennas is equal with the number of orthomode transducers. In some embodiments, each orthomode transducer is connected with a dedicated antenna, e.g., a measurement antenna, also called feed antenna. Each orthomode transducer is connected with a dedicated output interface as well as two input interfaces via which differently polarized signals are received, e.g., orthogonally polarized signals like horizontally polarized signals and vertically polarized signals.

Moreover, the at least two orthomode transducers and/or the at least two antennas and/or the at least two measurement modules are construed identically. Therefore, the respective components of the orthomode transducer assembly are similar. Hence, the respective additional measurement polarizations are solely obtained due to the relatively rotated arrangement of the orthomode transducers, for example the relatively rotated arrangement of the measurement modules. The relatively rotated arrangement means that the respective components of the orthomode transducer assembly are located stationary or rather fixedly positioned with respect to each other, but their polarization reference planes are tilted or rather inclined with respect to each other, e.g. by 45°.

Another aspect provides that an antenna phase center separation is below 2 cm. Therefore, it is not necessary to re-position the device under test during testing, as the resulting shift of the quiet zone is minimized when changing the antenna for testing purposes. Accordingly, the measurement modules of the orthomode transducer assembly are positioned with respect to each other such that the output interfaces of the measurement modules to which the antennas are connected are located in proximity with each other, resulting in the antenna phase center separation of less than 2 cm, for example less than 1.8 cm, preferably (about) 1.6 cm.

In addition, the over-the-air measurement system comprises at least one reflector. The reflector can be used for increasing the travelling distance of the electromagnetic waves along a beam path between the antenna(s) and the device under test, thereby ensuring (indirect) far-field (IFF) conditions. Therefore, the device under test can be tested under real conditions, namely under far-field conditions.

The at least two antennas may be located substantially at a focal point of the at least one reflector. Since the phase centers of both antennas are separated by less than 2 cm, it can be ensured that both antennas are located substantially at the focal point of the at least one reflector such that a quiet zone shift is minimized.

Further, each of the at least two measurement modules may comprise a housing that accommodates the respective orthomode transducer. The orthomode transducer is located inside the respective housing to which the antenna is connected, for example an output interface provided at an outer side of the housing.

Each of the at least two measurement modules may comprise two input ports and one output port, wherein the respective antenna is connected with the output port. The ports provide the respective interfaces for interconnecting waveguides and/or the antennas. Hence, the ports may be located at outer surfaces of the respective housing such that the respective waveguide(s) and/or antenna(s) can be connected easily to the respective measurement module.

In addition, an RF-shielded chamber may be provided. The RF-shielded chamber ensures that interfering or disturbing signals can be shielded appropriately such that the testing conditions are improved, yielding more reliable characterizations of the device under test.

In addition, the over-the-air measurement system comprises a measurement equipment. The measurement equipment may provide the respective differently polarized signals forwarded to the orthomode transducer assembly, for example its input ports. Thus, the measurement equipment may comprise a signal generator, wherein the measurement equipment is connected with respective waveguides that are connected with the input ports such that the signals generated are forwarded to the orthomode transducer assembly, namely the differently polarized signals.

Furthermore, analysis equipment may be provided that is connected with the orthomode transducer assembly and/or the device under test in order to receive signals to be analyzed to characterize the behavior of the device under test during the testing.

Moreover, a positioner system for the device under test may be provided. The positioner system may be used for rotating the device under test during the testing in order to characterize the device under test sufficiently, for example in several directions. In some embodiments, the positioner system may be a three-dimensional (3D) positioner system, for instance a phone positioner and a tablet positioner in case of testing a mobile phone or rather a tablet.

In general, the positioner system ensures highly accurate azimuth and elevation positioning of the device under test, for example within the quiet zone(s).

In some embodiments, total radiated power (TRP) measurements can be performed accurately and fast.

The over-the-air measurement system may be a far-field system. In some embodiments, direct far-field conditions may be provided due to the distances ensured between the antenna(s) and the device under test.

In other words, the over-the-air measurement system may be a compact antenna test range (CATR) system. The compact antenna test range system comprises the reflector that is used for increasing the travelling distance of the electromagnetic signals, thereby ensuring (indirect) far-field conditions for testing the device under test under far-field conditions.

In general, a compact multi-band orthomode transducer assembly is provided that has two or more orthomode transducers, for instance three orthomode transducers. The input interfaces associated with one orthomode transducer provide differently polarized signals, e.g., orthogonal polarized signals like horizontally polarized signals and vertically polarized signals. Each orthomode transducer of the multi-band orthomode transducer assembly may split a respective signal received via the output interface into two components that are polarized orthogonally with respect to each other, wherein the components are forwarded to the input interfaces. Further, each orthomode transducer is also configured to combine orthogonally polarized signals received via the input interfaces to a combined signal that is forwarded to the output interface.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
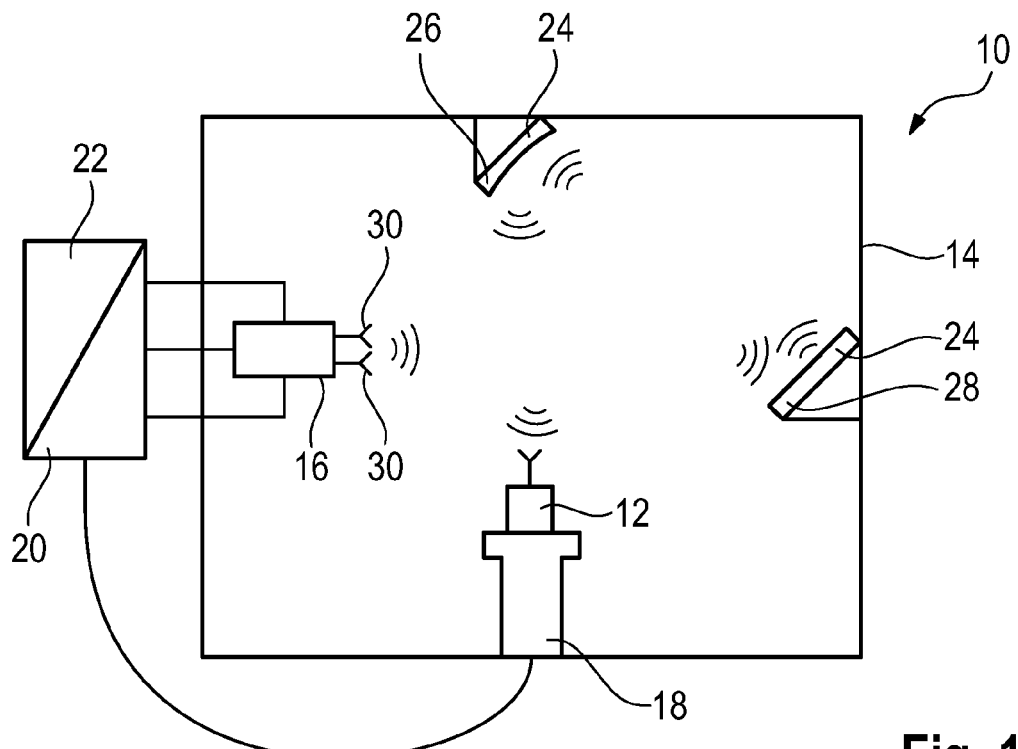
FIG. 1 schematically shows an overview of an over-the-air measurement system according to an embodiment of the present disclosure, FIG. 2 schematically shows an overview of an over-the-air measurement system according to another embodiment of the present disclosure FIG. 3 schematically shows a front view on the orthomode transducer assembly having two measurement modules.

FIG. 1 shows an over-the-air measurement system 10 that is used for testing a device under test 12. The over-the-air measurement system 10 comprises an anechoic or RF shielded chamber 14 that accommodates the device under test 12 as well as an orthomode transducer (OMT) assembly 16 that is used for testing the device under test 12 as will be described hereinafter in more detail.

The over-the-air measurement system 10 further comprises a positioner system 18 for the device under test 12, wherein the positioner system 18 may be configured to rotate the device under test 12 at least along one rotational axis during the testing, for example in a three-dimensional manner, namely along at least two rotational axes. In an embodiment, the positioner system 18 includes one or more rotational stages, and in other embodiments, includes two or more rotational stages The device under test 12 is mounted on the positioner system 18.

In addition, the over-the-air measurement system 10 comprises, for example, measurement equipment 20 as well as analysis equipment 22, which are connected with the orthomode transducer assembly 16 and/or the positioner system 18 appropriately. Further, signals received by the device under test 12 may be forwarded to the analysis equipment 22 such that a respective communication connection is also established between the device under test 12 and the analysis equipment 22. Moreover, the measurement equipment 20 may be connected to the device under test 12. In an embodiment, the measurement equipment 20 and/or the analysis equipment 22 include circuitry configured to measure and/or analyze signals, data, etc.

The respective connections between the measurement equipment 20 and the orthomode transducer assembly 16 may be established by waveguides that forward differently polarized signals to the orthomode transducer assembly 16.

Furthermore, it is shown in FIG. 1 that the over-the-air measurement system 10 comprises two reflectors 24, namely a main reflector 26 as well as a sub-reflector 28. Accordingly, the over-the-air measurement system 10 shown in FIG. 1 is a multi-reflector system. In the shown embodiment, the main reflector 26 is established as a paraboloid reflector, whereas the sub-reflector 28 is established as a non-paraboloid reflector.

The main reflector 26 may be orientated towards the device under test 12, for example a test location at which the device under test 12 is positioned for testing purposes, whereas the sub-reflector 28 is orientated towards the orthomode transducer assembly 16. The reflectors 24 may further be orientated towards each other. Hence, beam paths are established between the orthomode transducer assembly 16 and the device under test 12 via the respective reflector(s) 24 as indicated in FIG. 1.

Figure 3:
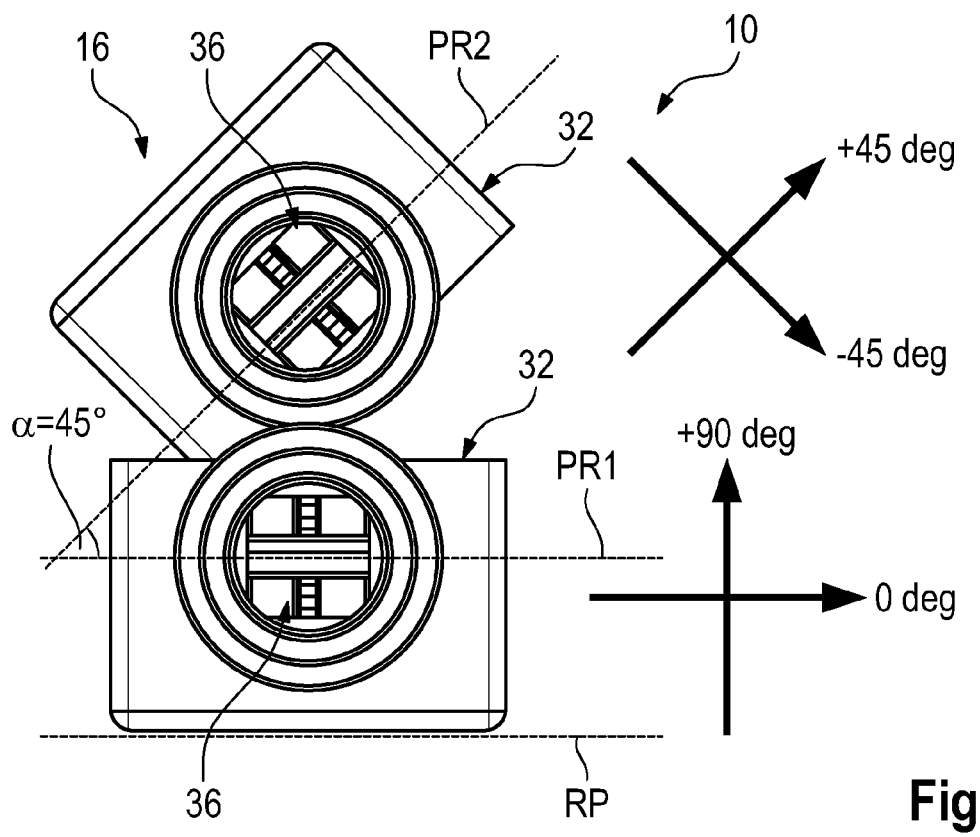
Figure 4:
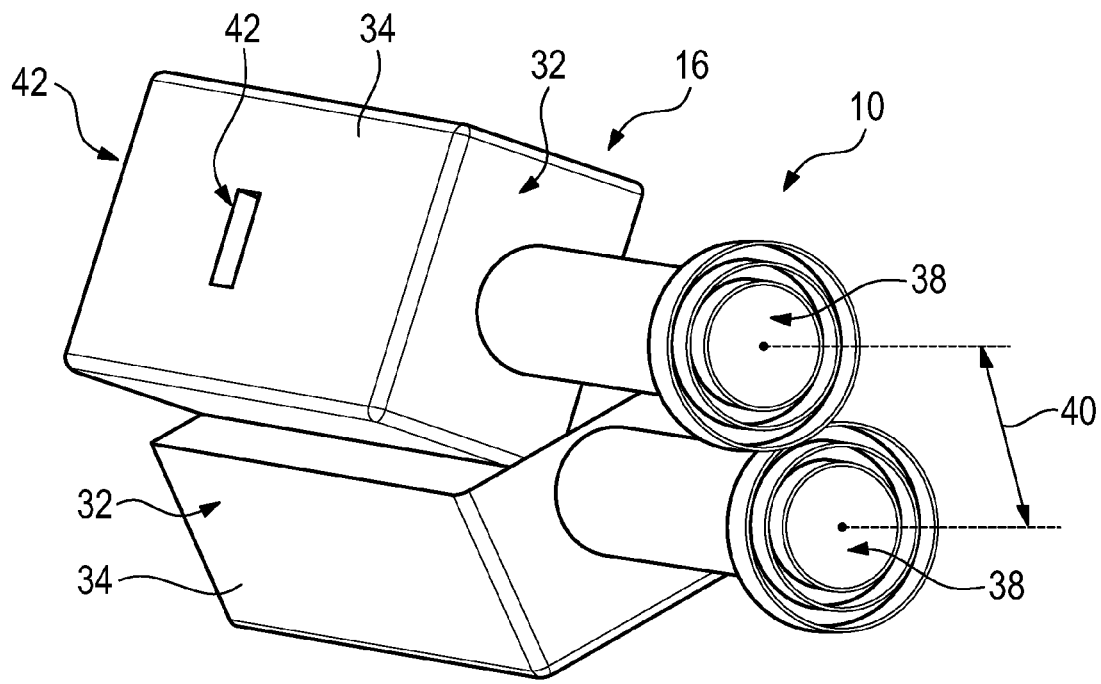
FIG. 4 shows an isometric view on the orthomode transducer assembly of FIG. 3.

In the shown embodiment, the orthomode transducer assembly 16 has two antennas 30 that are directed towards the respective reflector(s) 24, for example the sub-reflector 28. The antennas 30 are located at the orthomode transducer assembly 16 such that an antenna phase center separation is below 2 cm, e.g. at (about) 1.6 cm due to the specific arrangement. In other words, the orthomode transducer assembly 16, which is shown in FIGS. 3 and 4 in more detail, is construed such that the at least two antennas 30 are located substantially at a focal point of the at least one reflector 24, namely the sub-reflector 28.

In general, this ensures that axial ratio measurements and maximum power measurements of the respective device under test 12 having dual-polarized antenna(s) can be performed inside the anechoic or rather RF-shielded chamber 14 without the necessity of a feed switch or rather an antenna positioner, e.g. without moving the antenna(s) 30.

In the shown embodiment of FIG. 1, the reflectors 24 are located at two different lateral walls, e.g., a side wall and a ceiling. Of course, the reflectors 24 may also be located at a side wall and a bottom wall or rather at two different side walls. The same applies for the orthomode transducer assembly 16 that may be associated with a side wall, a bottom wall or rather a ceiling, which merely depends on the overall dimensions of the over-the-air test system 10.

Figure 2:
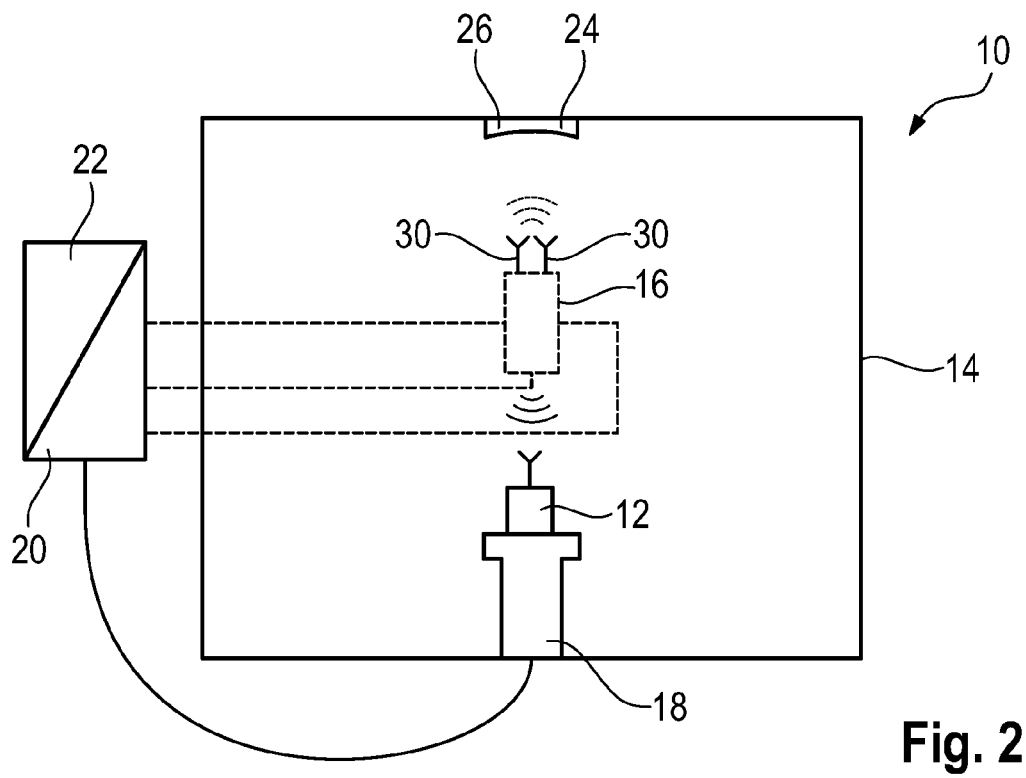

In FIG. 2, another embodiment of the over-the-air measurement system 10 is shown, which comprises only a single reflector 24. Accordingly, the over-the-air measurement system 10 shown in FIG. 2 is a single-reflector system.

The single reflector 24 corresponds to the main reflector 26 that is located in the beam path established between the device under test 12, e.g., a test location of the device under test 12, and the orthomode transducer assembly 16. As shown in FIG. 2, the (feed) antennas 30 of the orthomode transducer assembly 16 point towards the reflector 24, e.g., its center, wherein the reflector 24, for example its center, is centered with respect to the device under test 12, e.g., a test location of the device under test 12.

The orthomode transducer assembly 16 may be located in a different plane with respect to the device under test 12 such that the signals impinging on the reflector 24, namely the main reflector 26, and the ones reflected by the reflector 24, namely the main reflector 26, do not interfere with each other.

In FIGS. 3 and 4, the orthomode transducer assembly 16 is shown in more detail, wherein it becomes obvious that the orthomode transducer assembly 16 comprises two measurement modules 32 that are construed identically.

Each of the measurement modules 32 comprises a housing 34 that accommodates an orthomode transducer 36, respectively.

The antenna 30 of each measurement module 32 is connected with the respective orthomode transducer 36 accordingly. In some embodiments, the antennas 30 both are dual-polarized antennas, which is also shown in the diagrams on the right side of FIG. 3, which illustrate the respective polarizations.

As shown in FIG. 3, the orthomode transducers 36, for example the entire measurement modules 32, are rotated relative to each other, thereby providing different measurement polarizations of the at least two measurement modules 32. In some embodiments, one of the measurement modules 32 is rotated with respect to a common reference plane RP, namely the horizontal plane that is parallel to a polarization reference plane PR1 of one of the measurement modules 32, e.g., the respective orthomode transducer 36, whereas the polarization reference plane PR2 of the other measurement module 32, e.g., the respective orthomode transducer 36, is inclined to the common reference plane RP and the polarization reference plane PRE In the shown embodiment, the respective inclination is 45°.

However, the measurement modules 32 are stationary positioned such that they are static and not moved.

Hence, the orthomode transducer assembly 16 provides different measurement polarizations due to the inclined/tilted arrangement of the measurement modules 32. In the shown embodiment, the different measurement polarizations are each offset from each other by 45° as indicated on the right side of FIG. 3. Accordingly, both orthomode transducers 36, for example the associated antennas 30, together provide four different measurement polarizations in total, namely at 0°, 90° as well as −45° and 45° with respect to the common reference plane RP.

FIG. 4 further shows that the antennas 30 associated with output ports 38 are distanced from each other such that an antenna phase center separation 40 is below 2 cm, for example below 1.8 cm, such that it is not necessary to position the antennas 30 or rather the device under test 12 during the testing, as an occurring quiet zone offset is minimized when using both antennas 30.

The respective housings 34 each also have besides the output port 38 two input ports 42 via which differently polarized signals are received that are processed by the orthomode transducers 36. In some embodiments, orthogonally polarized signals are received and processed.

In general, the orthomode transducers 36, the at least two antennas 30 and/or the measurement modules 32 are construed identical, wherein they are fixedly arranged with respect to each other in a relatively rotated manner in order to ensure to obtain the different measurement polarizations.

In FIGS. 1 and 2, a compact antenna test range (CATR) is shown, wherein far-field conditions are obtained by the reflector(s) 24, e.g., indirect far-field conditions. However, the orthomode transducer assembly 16 may also be used in an over-the-air measurement system 10 without additional reflector(s) provided that the respective distances are ensured to obtain far-field conditions for testing the device under test 12. Hence, the over-the-air measurement system 10 may also be a far-field system.

Accordingly, a fast and cost-efficient way is ensured to perform measurements of dual-polarized devices under test, e.g. antennas under test, as a minimum of four measurements with four different polarizations can be done simultaneously by the over-the-air measurement system 10, for example the respective orthomode transducer assembly 16 that is shown in more detail in FIGS. 3 and 4.

In the foregoing description, specific details are set forth to provide a thorough understanding of exemplary embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

Throughout this specification, terms of art may be used. These terms are to take on their ordinary meaning in the art from which they come, unless specifically defined herein or the context of their use would clearly suggest otherwise.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An over-the-air measurement system for testing a device under test, wherein the over-the-air measurement system comprises at least two orthomode transducers and at least two antennas, wherein each of the antennas is connected to a dedicated orthomode transducer respectively, thereby establishing at least two measurement modules, and wherein the at least two orthomode transducers are rotated relative to each other, thereby providing different measurement polarizations of the at least two measurement modules with respect to a common reference plane.

2. The over-the-air measurement system according to claim 1, wherein each of the at least two antennas is a dual-polarized antenna.

3. The over-the-air measurement system according to claim 1, wherein the at least two antennas together provide four different measurement polarizations in total.

4. The over-the-air measurement system according to claim 1, wherein the at least two orthomode transducers are arranged relative to each other such that the different measurement polarizations are offset from each other by 45° with respect to the common reference plane.

5. The over-the-air measurement system according to claim 1, wherein the number of the antennas is equal with the number of orthomode transducers.

6. The over-the-air measurement system according to claim 1, wherein the at least two orthomode transducers and/or the at least two antennas and/or the at least two measurement modules are construed identically.

7. The over-the-air measurement system according to claim 1, wherein an antenna phase center separation is below 2 cm.

8. The over-the-air measurement system according to claim 1, wherein the over-the-air measurement system comprises at least one reflector.

9. The over-the-air measurement system according to claim 8, wherein the at least two antennas are located substantially at a focal point of the at least one reflector.

10. The over-the-air measurement system according to claim 1, wherein each of the at least two measurement modules comprises a housing that accommodates the respective orthomode transducer.

11. The over-the-air measurement system according to claim 10, wherein each of the at least two measurement modules comprises two input ports and one output port, and wherein the respective antenna is connected with the output port.

12. The over-the-air measurement system according to claim 1, wherein the over-the-air measurement system comprises an RF-shielded chamber.

13. The over-the-air measurement system according to claim 1, wherein the over-the-air measurement system comprises a measurement equipment.

14. The over-the-air measurement system according to claim 1, wherein the over-the-air measurement system comprises a positioner system for the device under test.

15. The over-the-air measurement system according to claim 1, wherein the over-the-air measurement system is a far-field system.

16. The over-the-air measurement system according to claim 1, wherein the over-the-air measurement system is a compact antenna test range system.

* * * * *